United States Patent
Hasebe et al.

(10) Patent No.: US 9,865,457 B2
(45) Date of Patent: Jan. 9, 2018

(54) NITRIDE FILM FORMING METHOD USING NITRADING ACTIVE SPECIES

(71) Applicant: TOKYO ELECTRON LIMITED, Tokyo (JP)

(72) Inventors: Kazuhide Hasebe, Nirasaki (JP); Akira Shimizu, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/341,767

(22) Filed: Nov. 2, 2016

(65) Prior Publication Data
US 2017/0125238 A1 May 4, 2017

(30) Foreign Application Priority Data

Nov. 4, 2015 (JP) ................................. 2015-216412

(51) Int. Cl.
*H01L 21/31* (2006.01)
*H01L 21/02* (2006.01)

(52) U.S. Cl.
CPC ...... *H01L 21/0228* (2013.01); *H01L 21/0217* (2013.01); *H01L 21/02211* (2013.01)

(58) Field of Classification Search
CPC ..... H01L 33/58; H01L 33/50; H01L 21/0228; H01L 21/0217; H01L 21/02211
See application file for complete search history.

(56) References Cited

U.S. PATENT DOCUMENTS

| 5,838,056 A * | 11/1998 | Kasai | H01L 21/28167 257/301 |
| 2007/0290293 A1* | 12/2007 | Trivedi | H01L 21/76224 257/506 |
| 2014/0209562 A1* | 7/2014 | LaVoie | C23C 16/045 216/2 |

FOREIGN PATENT DOCUMENTS

JP  2006-351689 A  12/2006

* cited by examiner

*Primary Examiner* — Whitney T Moore
*Assistant Examiner* — Herve Assouman
(74) *Attorney, Agent, or Firm* — Nath, Goldberg & Meyer; Jerald L. Meyer

(57) ABSTRACT

There is provided a method of forming a nitride film, including: repeating a cycle including an adsorption process of adsorbing a film forming precursor gas onto a substrate having a surface in which a fine recess is formed, the film forming precursor gas containing an element and chlorine constituting a nitride film to be formed; and a nitriding process of nitriding the adsorbed film forming precursor gas with nitriding active species, to form the nitride film in the fine recess. The nitriding process includes: generating NH* active species and N* active species as a nitriding active species; and controlling concentrations of the NH* active species and the N* active species to vary an area where the film forming precursor gas is adsorbed in the fine recess.

8 Claims, 7 Drawing Sheets

NITRIDE FILM FORMING METHOD USING NITRADING ACTIVE SPECIES

CROSS-REFERENCE TO RELATED APPLICATION

This application claims the benefit of Japanese Patent Application No. 2015-216412, filed on Nov. 4, 2015, in the Japan Patent Office, the disclosure of which is incorporated herein in its entirety by reference.

TECHNICAL FIELD

The present disclosure relates to a method of forming a nitride film such as a silicon nitride film or the like.

BACKGROUND

In a sequence of manufacturing a semiconductor device, there is a process of forming a nitride film such as a silicon nitride film (SiN film) or the like, serving as an insulating film, on a semiconductor wafer represented by a silicon wafer. A chemical vapor deposition (CVD) method is used for such a SiN film forming process.

When a trench is buried with a SiN film (CVD-SiN film) by the CVD method, voids or seams may occur. In this case, a method for etching-back up to the site where the voids or seams occurred and forming a SiN film again by the CVD method was used.

However, with a recent tendency to miniaturize devices, a step coverage in the CVD-SiN film is not sufficient. Thus, it becomes difficult to suppress the occurrence of voids or seams even by using the above method.

As a technique capable of forming a film with a step coverage better than that by the CVD method, an atomic layer deposition (ALD) method is known. This ALD method is used to bury a fine trench with a SiN film.

However, as devices become finer and finer, it becomes difficult to bury the fine trench with the SiN film while preventing the occurrence of voids or seams even by using the ALD method.

SUMMARY

Some embodiments of the present disclosure provide to a nitride film forming method which is capable of forming a nitride film in a fine recess without forming any voids or seams.

According to one embodiment of the present disclosure, there is provided a method of forming a nitride film, including: repeating a cycle including an adsorption process of adsorbing a film forming precursor gas onto a substrate having a surface in which a fine recess is formed, the film forming precursor gas containing an element and Chlorine constituting a nitride film to be formed; and a nitriding process of nitriding the adsorbed film forming precursor gas with nitriding active species, to form the nitride film in the fine recess, wherein the nitriding process includes: generating NH* active species and N* active species as a nitriding active species; and controlling concentrations of the NH* active species and the N* active species to vary an area where the film forming precursor gas is adsorbed in the fine recess.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a view illustrating a state in which an N—H termination of a surface is changed to N-terminations by $N_2$/Ar plasma or the like.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the present disclosure, a nitride film is formed by an ALD method. In this embodiment, a case where a silicon nitride film (SiN film) as the nitride film is formed will be described as an example.

<Outline of Silicon Nitride Film Forming Method According to this Embodiment>

In this embodiment, an adsorption process of a Si precursor (film forming raw material gas and a nitriding process based on nitriding active species are repeated a predetermined number of times to form an ALD-based SiN film.

When forming the ALD-based SiN film, in general a chlorine-containing silicon compound gas (Cl-containing Si compound gas) such as dichlorosilane (DCS; $SiH_2Cl_2$) or the like is used as the Si precursor and an $NH_3$ gas is used as a nitriding gas. Then, the nitriding process is performed by NH* active species that are generated by activating the $NH_3$ gas with plasma.

Figure 1:
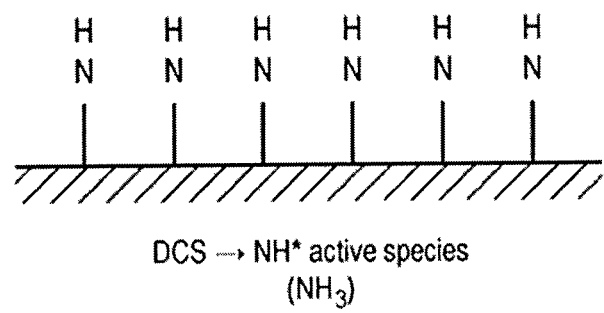
FIG. 1 is a view illustrating a state in which N—H terminations are obtained using NH* active species during a nitriding process.
Figure 2:
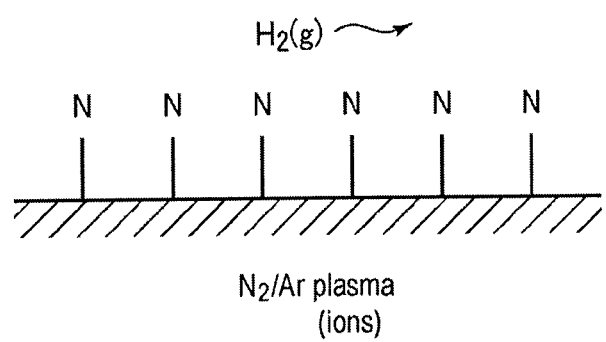

In this case, the Cl-containing Si compound gas used as the Si precursor is chemically adsorbed by exchanging ligands of Cl and H in N—H terminations existing in a surface. That is to say, as shown in FIG. 1, the Cl-containing Si compound gas can be adsorbed by changing a terminator to the N—H terminations with the NH* active species (radicals) at the time of the nitriding process. On the other hand, as shown in FIG. 2, if the N—H terminations of the surface is changed to N-terminations by $N_2$/Ar plasma or the like, a Si precursor is not adsorbed at portions where the N—H terminations are changed to the N-terminations. This inhibits a film from being formed.

In addition, as described above, the NH* active species obtained by plasmarizing the $NH_3$ gas have been conventionally used for the nitriding process. In this regard, a step coverage has been evaluated to check the buriability for a fine trench in a case where NH* active species are generated using the $NH_3$ gas and a case where N* active species are generated using an $N_2$ gas. As a result, the evaluation showed that the step coverage based on the NH* active species is greatly different from the step coverage based on the NH* active species.

Figure 3:
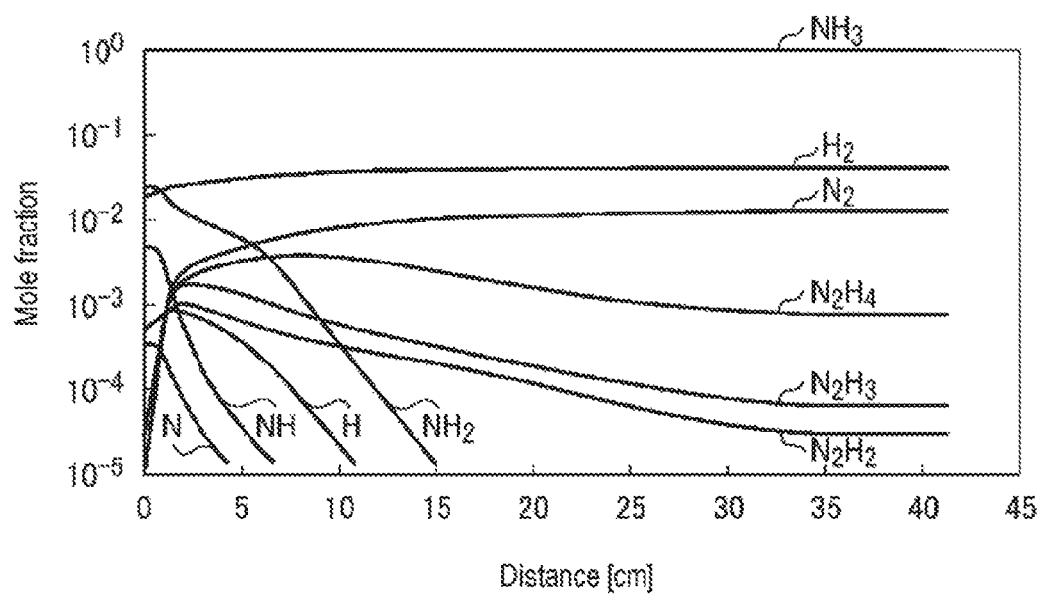
FIG. 3 is a view illustrating a simulation result which represents a relationship between a distance from the entrance of radical components and a mole fraction.
Figure 4:
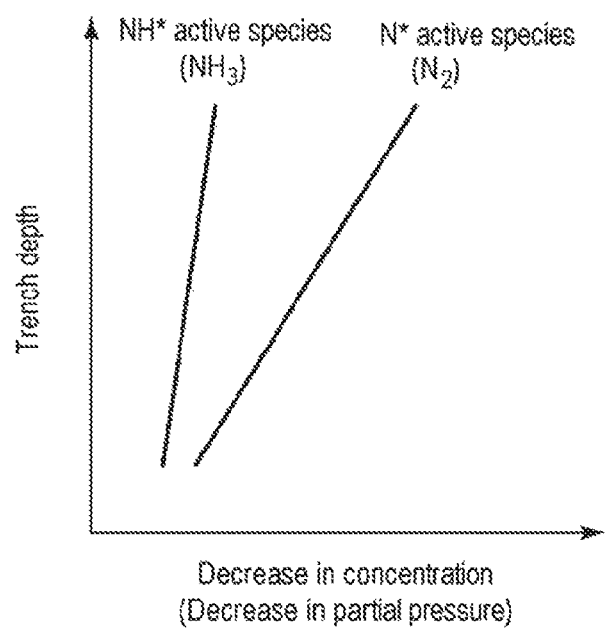
FIG. 4 is a view illustrating a change in concentration (partial pressure) of NH* active species and N* active species in a depth direction.

FIG. 3 shows a simulation result which represents a relationship between a distance from the entrance of N—H-based radical components and a mole fraction when a flow rate is 62.5 sccm, a pressure is 50 Pa and a temperature is 823 degrees C. As can be seen from FIG. 3, the lifetime of N atoms as the N* active species is short, whereas the lifetime of $NH_2$ as the NH* active species is longer than the lifetime of N atoms as the N* active species. Thus, as shown in FIG. 4, the NH* active species derived from $NH_3$ manifests a relatively small reduction in concentration (partial pressure) n a trench depth direction, whereas the N* active species derived from $N_2$ manifests a relatively large reduction in concentration (partial pressure) in the trench depth direction. Thus, it is obvious that such a situation involves the step coverage.

With this phenomenon as a trigger, it has been found that a region where a Si precursor is adsorbed in a fine trench can be changed by controlling the concentrations of the NH* active species and the N* active species at the time of the nitriding process. Specifically, if the concentration of the N* active species is high, an N—H termination in the top portion of the fine trench is changed to an N-termination by the N* active species and the N—H termination still remains in the bottom portion of the fine trench, which the N* active species does not reach. This shows the following phenomenon: SiN grows from the bottom portion of the trench as the Si precursor is selectively adsorbed in the bottom portion of the trench and subsequently, if the concentration of the N* active species is decreased, the site where the precursor is adsorbed is increased so that SiN can undergo a bottom-up growth from the bottom portion of the trench.

That is to say, in this embodiment, at the time of the nitriding process, by increasing the concentration of the N* active species, the N—H termination of the surface is changed to N-termination in the top portion of the fine trench where the N* active species is not deactivated. A Si precursor composed of a Cl-containing Si compound is not adsorbed in a portion where the N—H termination of the surface is changed to the N-termination. Thus, the film formation is inhibited. In contrast, in the bottom portion of the fine trench which the N* active species does not reach, the N—H termination still remains and the Si precursor is adsorbed. Thus, a SiN film is formed. Therefore, by decreasing the concentration of the N* active species and increasing the concentration of the NH* active species continuously from this state, the adsorption site of the Si precursor is increased so that SiN undergoes a bottom-up growth, ultimately a conformal growth, in the fine trench. As described above, by continuously increasing the NH* active species while keeping the concentration of the N* active species at a high level in the nitriding process, it is possible to control SiN to grow from the bottom portion of the fine trench such that the bottom-up growth is transited to the conformal growth. Further, it is possible to bury the fine trench with a SiN film without blocking an opening of the fine trench. Therefore, it is possible to form a SiN film without forming voids or seams in the fine trench.

<Specified Method of Forming Silicon Nitride According to this Embodiment>

Hereinafter, a specified method of forming a silicon nitride film according to this embodiment will be described with reference to FIGS. 5A to 5D. FIGS. 5A to 5D are process sectional views for explaining the nitride film forming method according to this embodiment.

Figure 5:
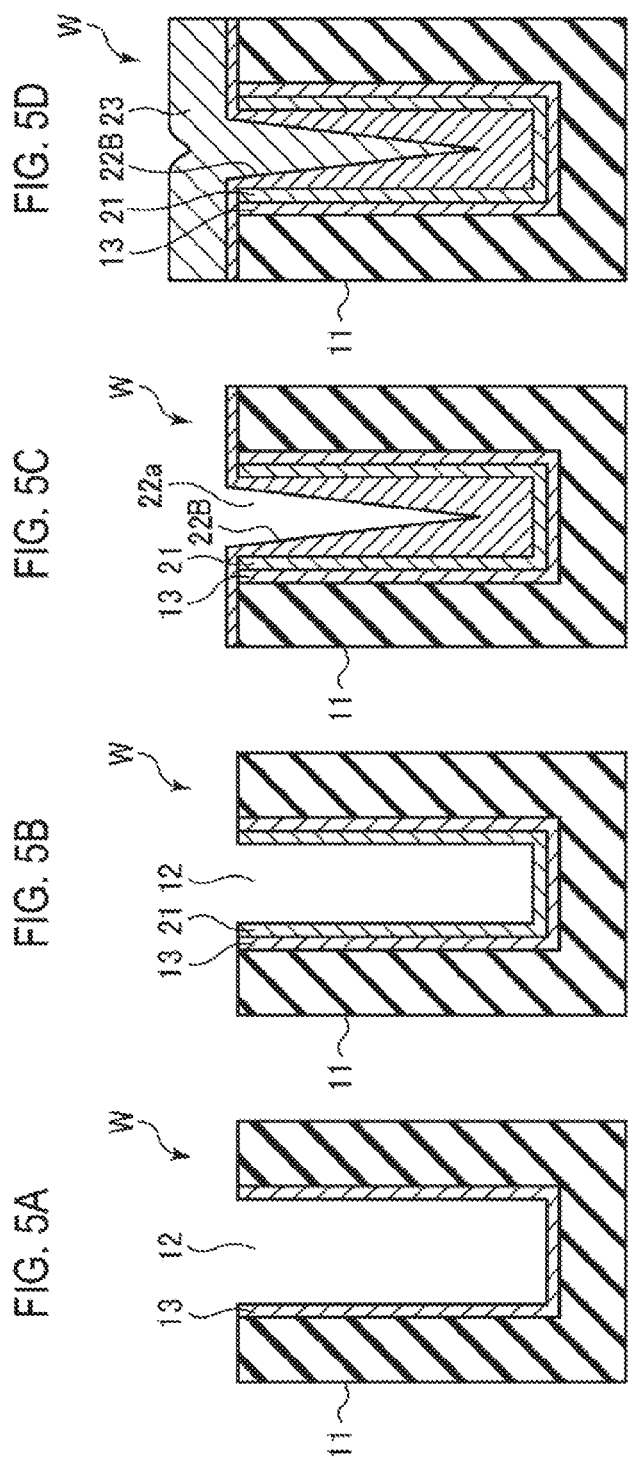
FIGS. 5A to 5D are process sectional views for explaining a nitride film forming method according to one embodiment of the present disclosure.

First, a wafer W including an insulating film 11, a fine trench 12 formed in the insulating film 11 and a liner film 13 formed in an inner wall of the fine trench 12 is prepared (FIG. 5A). In this state, formation of a SiN film starts.

The formation of the SiN film is perform d by alternately repeating an adsorption process of a Cl-containing Si compound gas as a Si precursor and a nitriding process based on nitriding active species. At this time, in some embodiments, a temperature may fall within a range of 150 to 600 degrees C. and a pressure may falls within a range of 13 to 665 Pa.

Examples of the Cl-containing Si compound gas may include monochrome silane (MCS; $SiH_3Cl$), trichlorosilane (TCS; $SiHCl_3$), silicon tetrachloride (STC; $SiCl_4$), hexachlorodisilane (HCD; $Si_2Cl_6$) and the like, in addition to the above-mentioned dichlorosilane (DCS).

In addition, an H-containing gas and an $N_2$ gas are used as a nitriding gas used for the nitriding process. The H-containing gas may be the above-mentioned $NH_3$ gas or $H_2$ gas. Further, an inert gas such as an Ar gas may be added in the nitriding gas. In either case, these gases are activated by plasma generating means or the like. Through gases thus activated, NH* active species and N* active species are generated. An example of the NH* active species may include $NH_2$, NH or the like, and an example of the N* active species may include N atoms. A purging process based on the inert gas is performed between the adsorption process of the Si precursor and the nitriding process. The plasma generating means at this time is not particularly limited but may be any means as long as it can generate NH* active species and N* active species. In addition, an activating means used in generating the NH* active species and the N* active species is not limited to the plasma generating means.

At an initial stage of the film formation, the opening of the fine trench 12 is not narrow Thus, as a first step, as shown in FIG. 5B, a conformal film is formed using the NH* active species as a main component in the nitriding process. Thus, a conformal SiN film 21 is formed as an initial film.

At the point of time when the conformal SiN film 21 has a certain thickness and the opening of the fine trench 12 becomes narrow, a film forming process of a second step in the method of this embodiment is performed (FIG. 5C).

Figure 6:
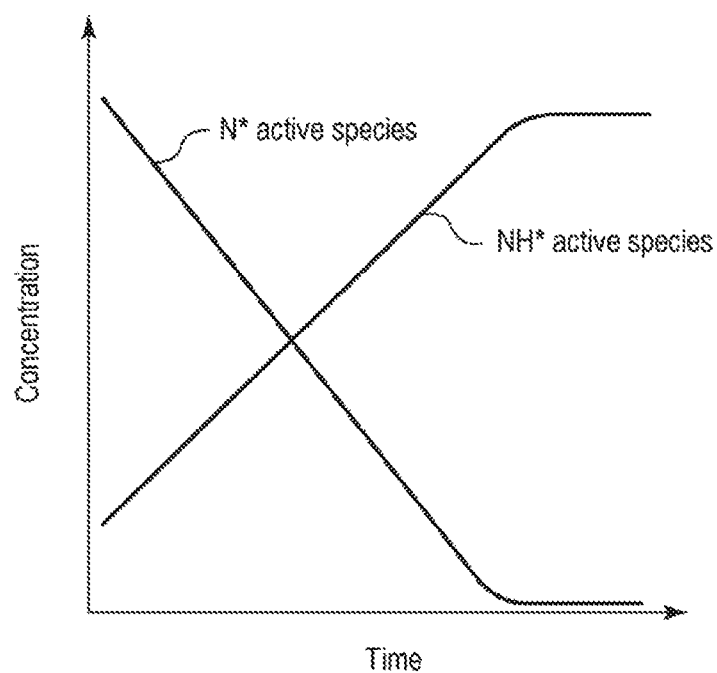
FIG. 6 is a view schematically illustrating a change in concentration of NH* active species and N* active species in a nitriding process when the nitride film forming method according to one embodiment of the present disclosure is performed.

In the second step, first, the concentration of the N* active species in the nitriding process is set at a high level and the concentration of the NH* active species in the nitriding process is set at a low level. As a result, in the top portion of the fine trench 12, N—H terminations in a surface after nitriding process are changed to N-terminations by the N* active species. In contrast, most of the N* active species having a short lifetime hardly reach the bottom portion of the fine trench 12 so that the N—H terminations still remain in the bottom portion. Therefore, a relatively small amount of Si precursor is adsorbed in the top portion of the fine trench 12 so that the film formation is inhibited, whereas a relatively large amount of Si precursor is adsorbed in the bottom portion of the fine trench 12 so that the film formation is performed. This makes it possible to grow SiN from the bottom portion of the fine trench 12. Further, as shown in FIG. 6, by continuously decreasing the concentration of the N* active species and increasing the concentration of the NH* active species, SiN undergoes a bottom-up growth from the bottom portion of the fine trench 12. Further, the concentrations of the NH* active species and the N* active species can be controlled by flow rates of the $NH_3$ gas and the gas.

In other words, by decreasing the concentration of the N* active species in this way, the site where the Si precursor is adsorbed in the top portion of the fine trench 12 is enlarged so that the inhabitation of the film formation is alleviated. Thus, the SiN film undergoes the bottom-up growth inside the fine trench 12 and is also formed on the side wall of the fine trench 12 in such an extent that the opening of the fine trench 12 is not narrowed. As a result, a bottom-up SiN film 22B having a V-shaped recess 22a is formed on the center of the top of the conformal SiN film 21, as shown in FIG. 5C.

In some embodiments, depending on the shape of the fine trench 12, the first step may be omitted and the film formation of the second step may be initially performed.

Subsequently, with the continuous change in concentration, the N* active species are decreased so that most of the active species are Changed to the NH* active species, thus achieving a conformal film formation. Thus, a conformal SiN film 23 is formed so as to bury the V-shaped recess 22a remaining at the time of bottom-up film formation. In this way, the burying of the SiN film in the fine trench 12 is completed (FIG. 5D).

As described above, in this embodiment, by controlling the concentrations of the NH* active species and the N* active species in the nitriding process, it is possible to control the adsorption of the Si precursor onto the top portion of the fine trench. Accordingly, SiN grows from the bottom portion of the fine trench, which makes it possible to control such that the bottom-up growth is transited to the conformal film formation. This makes it possible to form the SiN film in the fine trench without forming any voids or seams, which could not be resolved by a CVD method or a typical ALD method.

<Film Forming Apparatus>

Next, an example of a film forming apparatus for performing the nitride film forming method according to the above embodiment will be described.

(First Example of Film Forming Apparatus)

Figure 7:
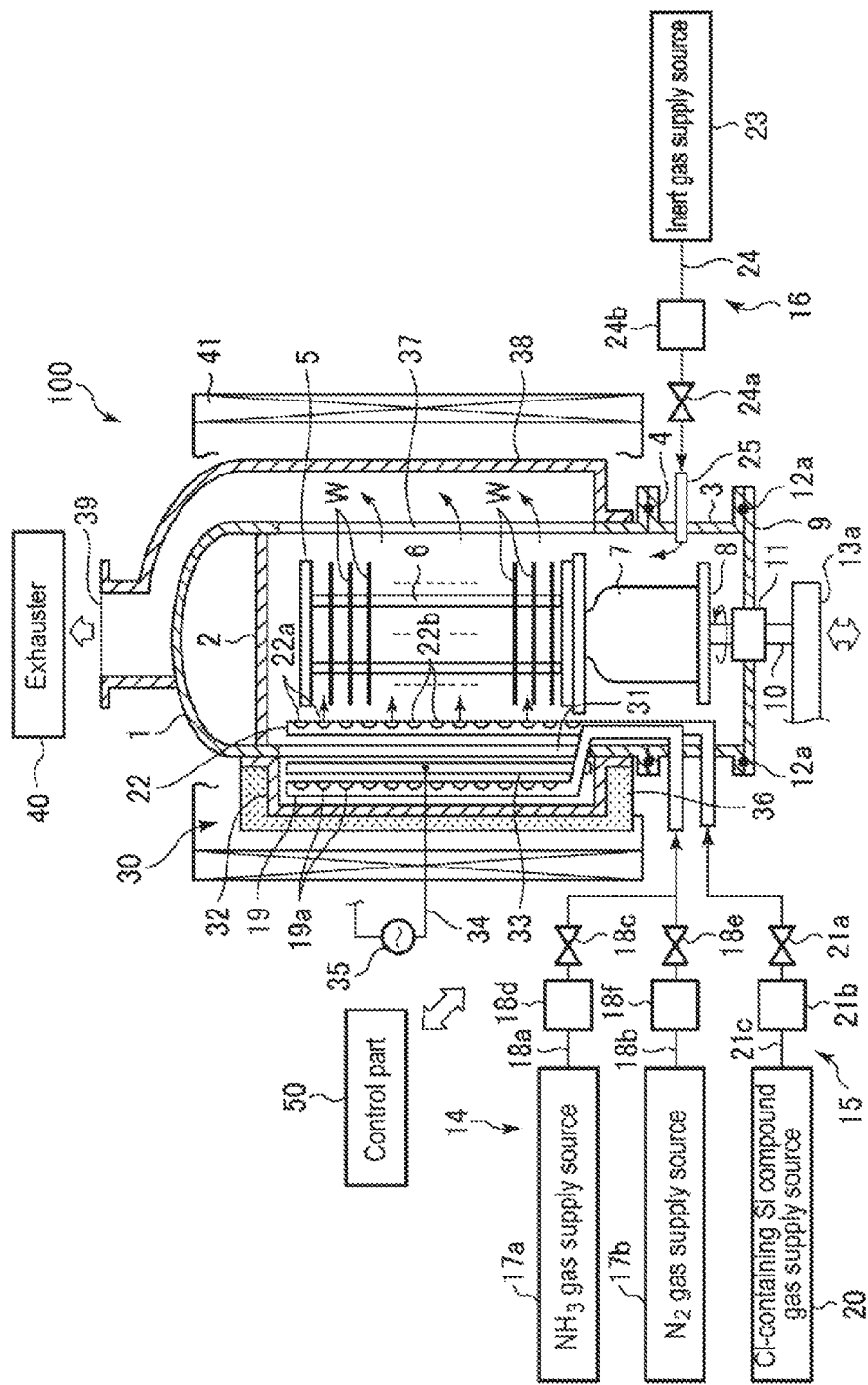
FIG. 7 is a longitudinal sectional view schematically showing a first example of a film forming apparatus for performing the nitride film forming method according to one embodiment of the present disclosure.
Figure 8:
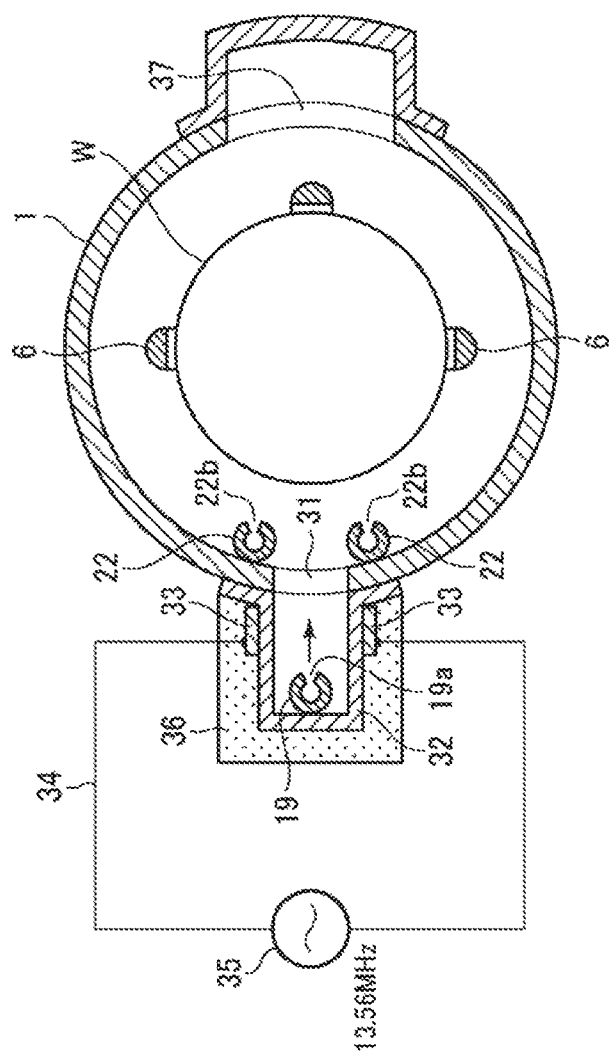
FIG. 8 is a horizontal sectional view schematically showing the first example of the film forming apparatus for performing the nitride film forming method according to one embodiment of the present disclosure.

FIG. 7 is a longitudinal sectional view schematically showing a first example of a film forming apparatus for performing the nitride film forming method according to one embodiment of the present disclosure, and FIG. 8 is a horizontal sectional view of the film forming apparatus shown in FIG. 7.

A film forming apparatus 100 of this example includes a cylindrical processing container 1 having a ceiling, of which a lower end portion is opened. The entire processing container 1, for example, is formed of quartz, and a ceiling plate 2 of quartz is disposed near an upper end portion inside the processing container 1. A region defined below the ceiling plate 2 is sealed. Also, for example, a manifold 3 which is made of metal to have a cylindrical shape is connected to a lower end opening portion of the processing container 1 through a seal member 4 such as O-ring.

The manifold 3 supports a lower end portion of the processing container 1. A wafer boat 5 of quartz, in which a plurality of (e.g., 50 to 100) semiconductor wafers (silicon wafers) W are loaded as target substrates in multiple stages, is insertable into the processing container 1 through a lower portion of the manifold 3. The wafer boat 5 includes three supporting pillars 6 (see FIG. 8), and the plurality of wafers W are supported by grooves formed in each of the supporting pillars 6.

The wafer boat 5 is loaded on a table 8 through a heat insulating tube 7 made of quartz. The table 8 is supported on a rotation axis 10 that passes through a cover part 9 which is made of metal (stainless steel) and opens or closes a lower end opening portion of the manifold 3.

A magnetic fluid seal 11 is disposed at a through portion of the rotation axis 10. The magnetic fluid seal 11 closely seals and rotatably supports the rotation axis 10. Also, a seal member 12a is disposed between a peripheral portion of the cover portion 9 and a lower end portion of the manifold 3, thus maintaining sealability in the processing container 1.

The rotation axis 10, for example, is disposed at a front end of an arm 13a that is supported by an ascending/descending instrument such as a boat elevator. The rotation axis 10 ascends or descends the wafer boat 5 and the cover part 9 integratedly, and is inserted into or detached from the processing container 1. Also, the table 8 may be disposed to be fixed to the cover part 9 side, and the wafer W may be treated without the rotation of the wafer boat 5.

In addition, the film forming apparatus 100 includes a nitriding gas supply mechanism 14 configured to supply nitriding gases such as an $NH_3$ gas and an $N_2$ gas into the processing container 1, a Cl-containing Si compound gas supply mechanism 15 configured to supply a Cl-containing Si compound gas such as a DCS gas into the processing container 1, and an inert gas supply mechanism 16 configured to supply an inert gas such as an Ar gas, as a purge gas or the like, into the processing container 1.

The nitriding gas supply mechanism 14 includes an $NH_3$ gas supply source 17a, an $N_2$ gas supply source 17b, an $NH_3$ gas pipe 18a through which the $NH_3$ gas is introduced from the $NH_3$ gas supply source 17a, an $N_2$ gas pipe 18b through which the $N_2$ gas is introduced from the $N_2$ gas supply source 17b, and a gas dispersion nozzle 19 which is connected to the gas pipes 18a and 18b and introduces the $NH_3$ gas and the $N_2$ gas into the processing container 1.

The Cl-containing Si compound gas supply mechanism 15 includes a Cl-containing Si compound gas supply source 20, a gas pipe 21c through which the Cl-containing Si compound gas is introduced from the Cl-containing Si compound gas supply source 20, and a gas dispersion nozzle 22 which is connected to the gas pipe 21c and introduces the Cl-containing Si compound gas into the processing container 1.

Each of the gas dispersion nozzles 19 and 22, which is made of quartz, pierces the sidewall of the manifold 3 inward, bends upward, and extends vertically. At a vertical portion of each of the gas dispersion nozzles 19 and 22, a plurality of gas discharge holes 19a and 22b is respectively formed at predetermined intervals over a vertical length corresponding to a wafer support range of the wafer boat 5. A gas can be substantially uniformly discharged from each of the gas discharge holes 19a and 22b toward the processing container 1 in the horizontal direction. While in this example, two gas dispersion nozzles 22 have been shown to be installed, a single gas dispersion nozzle 22 may be installed.

The inert gas supply mechanism 16 includes an inert gas supply source 23, a gas pipe 24 through which the inert gas is introduced from the inert gas supply source 23, and a gas nozzle 25 which is connected to the gas pipe 24 and is formed of a short quartz pipe installed to penetrate through the sidewall of the manifold 3. An Ar gas or the like may be used as the inert gas.

On/off valves 18c, 18e, 21a and 24a and flow rate controllers 18d, 18f, 21b and 24b are respectively installed in the gas pipes 18a, 18b, 21 and 24.

A plasma generation mechanism 30 is installed in a portion of the sidewall of the processing container 1. The plasma generation mechanism 30 is to excite (activate) the nitriding gases such as the $NH_3$ gas and the $N_2$ gas into plasma, thus generating NH* active species and N* active species. The plasma generation mechanism 30 includes a plasma partition wall 32 welded air-tightly to the outer wall of the processing container 1. The plasma partition wall 32 is made of, e.g., quartz. The plasma partition wall 32 has a recessed sectional shape and covers an opening 31 formed in the sidewall of the processing container 1. The opening 31 is formed to be vertically elongated so as to vertically cover all the semiconductor wafers W supported by the wafer boat 5. The gas dispersion nozzle 19 configured to discharge the $NH_3$ gas and the $N_2$ gas is disposed in an inner space defined by the plasma partition wall 32, namely, a plasma generation space. Incidentally, the two gas dispersion nozzles 22 are installed at both sides of the opening 31 formed in the inner side wall of the processing container 1.

In addition, the plasma generation mechanism 30 further includes a pair of elongated plasma electrodes 33 which are vertically arranged to face each other on outer surfaces of both sidewalls of the plasma partition wall 32, and a high frequency (RF) power source 35 which is coupled to each of the pair of plasma electrodes 33 via a power feeding line 34 and supplies RF power to the pair of plasma electrodes 33. The RF power source 35 applies an RF voltage of, e.g., 13.56 MHz, to the pair of plasma electrodes 33. Thus, an RF electric field is applied into the plasma generation space defined by the plasma partition wall 32. The nitriding gas discharged from the gas dispersion nozzle 19 is plasmarized in the plasma generation space into which the RF electric field is applied, and is supplied as a plasma gas containing NH* active species and N* active species into the processing container 1 via the opening 31.

An insulating protective cover 36 is attached to the outer surface of the plasma partition wall 32 so as to cover the plasma partition wall 32. A refrigerant passage (not shown) is installed in an inner portion of the insulating protective cover 36. By flowing a cooled refrigerant such as a nitrogen gas through the refrigerant passage, the plasma electrodes 33 are cooled down.

An exhaust port 27 for evacuating the interior of the processing container 1 is formed in a portion facing the gas dispersion nozzles 19 and 22 in the sidewall of the processing container 1. The exhaust port 37 is formed to be vertically elongated. In a portion corresponding to the exhaust port 37 in the processing container 1, an exhaust port cover member 38 having a U-shaped section is installed to cover the exhaust port 37. The exhaust port cover member 38 extends upward along the sidewall of the processing container 1 and defines a gas outlet 39 in the top portion of the processing container 1. In addition, an exhauster 40 including a vacuum pump and so on is connected to the gas outlet 39. The interior of the processing container 1 is exhausted by the exhauster 40 via the gas outlet 39. In addition, a tube-like heating mechanism 41 configured to heat the processing container 1 and the wafers W accommodated in the processing container 1 is disposed to surround the outer periphery of the processing container 1.

The film forming apparatus 100 includes a control part 50. The control part 50 performs control operations for respective components of the film forming apparatus 100, for example, a supply/stop operation of respective gases performed by opening/closing the valves 18c, 18e, 21a and 24a, a flow rate control of respective gases performed by the flow rate controllers 18d, 18f, 21b and 24b, an exhaust control performed by the exhauster 40, On/Off control of RF power performed by the RF power source 35, control of temperature of the wafers W performed by the heating mechanism 41, and the like. The control part 50 includes a controller equipped with a microprocessor (computer), a user interface equipped with a keyboard through which an operator inputs commands to manage the film forming apparatus 100, a display for visually displaying operation situations of the film forming apparatus 100 thereon, and the like, and a storage part which stores a control program for implementing various processes executed in the film forming apparatus 100 under the control of the controller and programs (i.e., process recipes) for causing the respective components of the film forming apparatus 100 to perform the respective processes according to process conditions. As necessary, the control part 50 calls any recipes from the storage part according to an instruction provided from the user interface and causes the controller to execute the called recipes. Thus, a desired process is performed in the film forming apparatus 100 under the control of the controller.

In the film forming apparatus 100 configured as above, the silicon nitride film (SiN film) forming method of the above embodiment is implemented under the control of the control part 50. That is to say, first, an internal temperature of the processing container 1 is set to 150 to 600 degrees C., and the wafer boat 5 in which 500 to 100 sheets of wafers W each having a fine trench are mounted is loaded into the processing container 1. An internal pressure of the processing container 1 is adjusted to 13 to 665 Pa, while exhausting the interior of the processing container 1 by the exhauster 40.

Subsequently, a SiN film is formed by a film forming method based on an ALD method. This ALD method repeats an adsorption process of the Cl-containing Si compound gas and a nitriding process using NH* active species and N* active species generated by plasmarizing an $NH_3$ gas and an $N_2$ gas by the plasma generation mechanism 30, a multiple number of times, while purging the interior of the processing container 1 between the adsorption process and the nitriding process. Thus, the fine trench formed in the wafer W is buried with the SiN film.

At this time, as described above, the concentrations of the NH* active species and the N* active species are controlled during the nitriding process by adjusting flow rates of the $NH_3$ gas and the $N_2$ gas. Specifically, by increasing the concentration of the N* active species during the nitriding process, the N—H terminations of the surface are changed to N-terminations in the top portion of the fine trench where the N* active species is not deactivated, which inhibits a film formation. In contrast, the N—H terminations still remains in the bottom portion of the fine trench which the N* active species does not reach so that SiN grows from the bottom portion of the fine trench. By increasing the NH* active species continuously from this state, SiN undergoes a bottom-up growth in the fine trench. Further, by increasing the NH* active species, the SiN film conformity grows. Thus, it is possible to bury the fine trench with the SiN film without forming voids or seams which could not be resolved by a CVD method or a typical ALD method.

(Second Example of Film Forming Apparatus)

Figure 9:
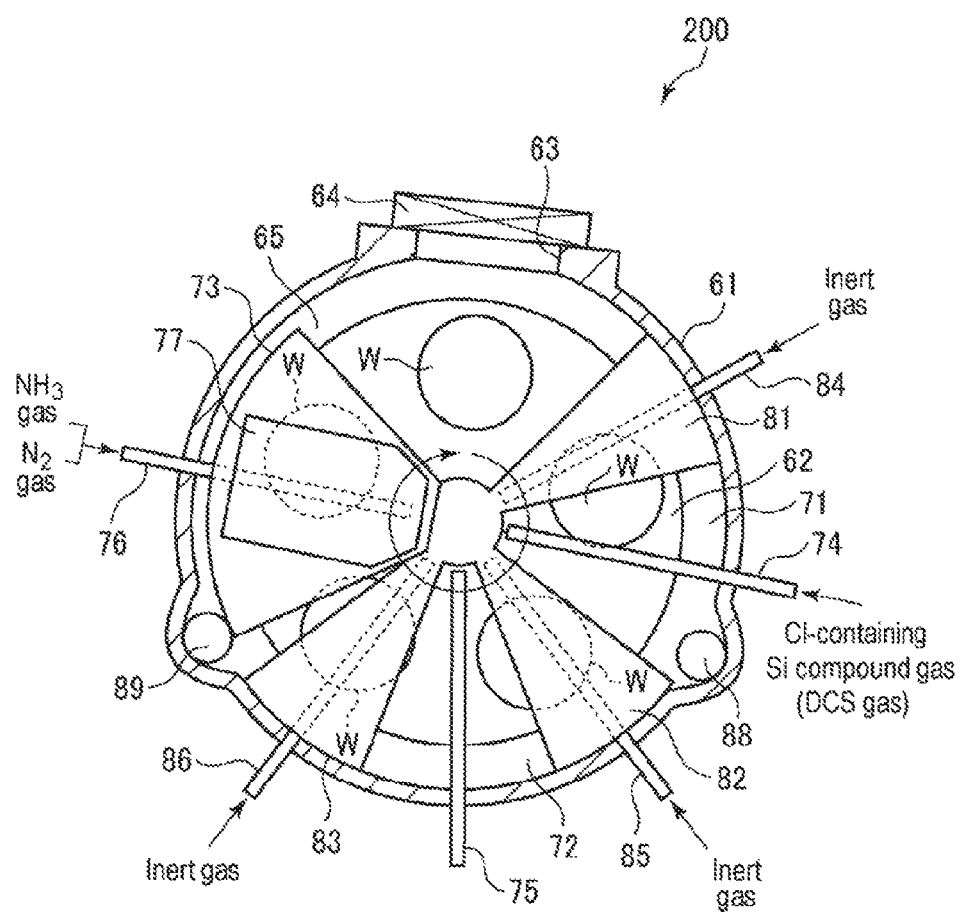
FIG. 9 is a horizontal sectional view schematically showing a second example of the film forming apparatus for performing the nitride film forming method according to one embodiment of the present disclosure.

FIG. 9 is a horizontal sectional view schematically showing a second example of the film forming apparatus for performing the nitride film forming method according to one embodiment of the present disclosure A film forming apparatus 200 of this example includes a cylindrical processing container 61. A turn table 62 on which a plurality of (e.g., five) wafers W is mounted is installed inside processing container 61. For example, the turn table 62 rotates clockwise.

A loading/unloading port 63 through which the wafer W is loaded into and unloaded from the processing container 61 is formed in a peripheral wall of the processing container 61. The loading/unloading port 63 is opened and closed by a gate valve 64. A portion corresponding to the loading/unloading port 63 in the processing container 61 is defined as a loading/unloading portion 65. Through the loading/unloading portion 65, the wafers W are loaded onto the turn table 62 and are unloaded from the turn table 62.

The interior of the processing container 61 is divided into six areas except for the loading/unloading portion 65 along a rotation region of the turn table 62. That is to say, the interior of the processing container 61 is divided into a first process area 71, a second process area 72 and a third process area 73, which are defined in a clockwise direction from the loading/unloading portion 65 side. Further, the interior of the processing container 61 is divided into a first separation area 81 defined between the loading/unloading portion 65 and the first process area 71, a second separation area 82 defined between the first process area 71 and the second process area 72, and a third separation area 83 defined between the second process area 72 and the third process area 73. With the rotation of the turn table 62, the wafers W sequentially pass through these six areas. The first to third separation areas 81 to 83 have the function of separating gas atmospheres of the first to third process areas 71 to 73, respectively.

In the first process area 71, the second process area 72 and the third process area 73, a first processing gas nozzle 74, a second processing gas nozzle 75 and a third processing gas nozzle 76 configured to discharge processing gases toward the wafers W mounted on the turn table 62 are installed radially along the diameter direction of the processing container 61, respectively.

In addition, a plasma generation mechanism 77 configured to plasmarize a processing gas discharged from the third processing gas nozzle 76 is installed in the third process area 73. The plasma generation mechanism 77 is provided with a housing formed of an RF transmitting member, and an RF antenna formed on the housing. The housing is installed to surround a space which includes a region through which the wafers W pass, and is defined above the turn table 62. If RF power is supplied to the RF antenna, inductively-coupled plasma is generated in a space in the housing so that the processing gas supplied from the third processing gas nozzle 76 is plasmarized by the generated plasma.

In the first separation area 81, the second separation area 82 and the third separation area 83, a first inert gas nozzle 84, a second inert gas nozzle 85 and a third inert gas nozzle 86 configured to discharge an inert gas toward the wafers W mounted on the turn table 62 are installed radially along the diameter direction of the processing container 61, respectively. Gas atmospheres are separated by the inert gas discharged from these nozzles 84 to 86.

Two exhaust ports 88 and 89 are formed in a bottom portion of the processing container 61. The interior of the processing container 61 is exhausted through these exhaust ports 88 and 89.

A processing gas supply mechanism, an inert gas supply mechanism, an exhauster, a heating device and a control part are not shown in FIG. 9. In addition, a heating device is installed within the turn table.

When the SiN film forming method of the above embodiment is performed using the apparatus of FIG. 9, a Cl-containing Si compound gas such as a DCS gas as a Si precursor is supplied from the first processing gas nozzle 74, and an $NH_3$ gas and an $N_2$ gas as a nitriding gas are supplied from the third processing gas nozzle 76. These gases are plasmarized by the plasma generation mechanism 77 to generate NH* active species and N* active species. In this example, the second processing gas nozzle 75 is not used. Accordingly, the first process area 71 is defined as a Si compound gas supply area, the third process area 73 is defined as a nitriding process area, and the second process area 72 is defined as an area through which the wafers W pass.

In the film forming apparatus 200 configured as above, the silicon nitride film (SiN film) forming method of the above embodiment is implemented under the control of a control part (not shown). That is to say, first, in a state where the turn table 62 is heated, a plurality of (e.g., five) wafers W is sequentially mounted on the turn table 62. A temperature of the wafers W is set to 150 to 600 degrees C., and an internal pressure of the processing container 61 is adjusted to 13 to 665 Pa.

Subsequently, the Cl-containing Si compound gas such as the DCS gas is discharged from the first processing gas nozzle 74, the $NH_3$ gas and the $N_2$ gas as the nitriding gas are discharged from the third processing gas nozzle 76. These gases are plasmarized by the plasma generation mechanism 77 so that the NH* active species and the N* active species are generated. Then, the turn table 62 rotates in astute where the inert gas is discharged from the first to third inert gas nozzles 84 to 86. Thus, the Cl-containing Si compound gas, the inert gas, the NH* active species and the N* active species, and an inert gas are sequentially supplied onto the wafers W. In this way, a SiN film is formed by a film forming method based on an ALD method so that the fine trench formed in each of the wafers W is buried with the SiN film.

At this time, as described above, the concentrations of the NH* active species and the N* active species are controlled during the nitriding process by adjusting flow rates of the $NH_3$ gas and the $N_2$ gas. Specifically, by increasing the concentration of the N* active species during the nitriding process, the N—H terminations of the surface are changed to N-terminations in the top portion of the fine trench where the N* active species is not deactivated, which inhibits a film formation. In contrast, the N—H terminations still remain in the bottom portion of the fine trench which the N* active species does not reach, so that SiN grows from the bottom portion of the fine trench. Further, by increasing the NH* active species continuously from this state, SiN undergoes a bottom-up growth in the fine trench. Further, by further increasing the NH* active species, SiN grows conformally. Thus, it is possible to bury the fine trench with the SiN film without forming voids or seams, which could not be resolved by a CVD method or a typical ALD method.

<Other Applications>

Although exemplary embodiments of the present disclosure have been described above, the present disclosure is not limited to the above embodiments but may be modified in different ways without departing from the spirit and scope of the present disclosure.

For example, although the above embodiments have been described with an example where the silicon nitride film is formed using the Cl-containing Si compound gas and a set of the NH* active species and the N* active species, the present disclosure is not limited thereto. In some embodiments, any different method may be applied as long as they can form a nitride film with a combination of Cl-containing Si compound gas and a set of NH* active species and N* active species. As an example, the present disclosure may be applied to a case where a combination of a $TiCl_4$ gas and a set of NH* active species and N* active species is used to form a TiN film, a case where a combination of a $BCl_3$ gas and a set of NH* active species and N* active species is used to form a BN film, a case where a combination of a $WCl_6$ gas and a set of NH* active species and N* active species is used to form a WN film, or the like.

In addition, the present disclosure is not limited to the film forming apparatuses illustrated herein but may be applied to various other film forming apparatuses such as a horizontal batch type apparatus, a single wafer type apparatus and so on.

According to the present disclosure in some embodiments, by generating NH* active species and N* active species as a nitriding active species and controlling concentrations of the NH* active species and the N* active species, an area where a film forming precursor gas is adsorbed in a fine recess is varied. Thus, it is possible to bury a fine trench with a nitride film without forming any voids or seams. Specifically, when a concentration of the N* active species is high, N—H terminations of the top portion of the fine recess are changed to N-terminations by the N* active species. The N—H terminations still remain in a bottom portion of the fine trench which the N* active species does not reach. Thus, the film forming precursor gas is adsorbed only the bottom portion of the fine recess. Therefore, the nitride film grows from the bottom portion of the fine recess. Thereafter, when the concentration of the N* active species is decreased, the site onto which the film forming precursor gas is adsorbed is increased, which makes it possible for the nitride film to undergo a bottom-up growth from the bottom portion of the trench. Further, it is possible to control the nitride film to undergo a conformal growth in a state where the concentration of the NH* active species is high. It is therefore possible to bury the fine trench with the nitride film without forming any voids or seams.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a nitride film, comprising:
repeating a cycle including an adsorption process of adsorbing a film forming precursor gas onto a substrate having a surface in which a fine recess is formed, the film forming precursor gas containing an element and chlorine constituting a nitride film to be formed; and a nitriding process of nitriding the adsorbed film forming precursor gas with nitriding active species, to form the nitride film in the fine recess,
wherein the nitriding process includes:
supplying an H-containing gas and an $N_2$ gas; and
generating NH* active species and N* active species as the nitriding active species, and
wherein during the nitriding process, flow rates of the H-containing gas and the $N_2$ gas are adjusted such that a concentration of the N* active species is decreased to enlarge an area of adsorption site where the film forming precursor gas is adsorbed in the fine recess.

2. The method of claim 1, wherein the nitriding process includes growing the nitride film from a bottom portion of the fine recess by continuously decreasing the concentration of the N* active species in a state where the concentration of the N* active species is high.

3. The method of claim 2, further comprising: before the growing the nitride film, forming a conformal nitride film by performing the nitriding process using mainly the NH* active species.

4. The method of claim 1, wherein the nitriding process generates the NH* active species and the N* active species by activating an H-containing gas and an $N_2$ gas.

5. The method of claim 4, wherein the H-containing gas is an $NH_3$ gas or an $H_2$ gas.

6. The method of claim 4, wherein the concentrations of the NH* active species and the N* active species are controlled by flow rates of the H-containing gas and the $N_2$ gas.

7. The method of claim 1, wherein the film forming precursor gas is a chlorine-containing silicon compound, and the nitride film is a silicon nitride film.

8. The method of claim 7, wherein the chlorine-containing silicon compound is at least one selected from a group consisting of dichlorosilane, monochlorosilane, trichlorosilane, silicon tetrachloride and hexachlorodisilane.

* * * * *